US008599292B2

(12) United States Patent
Chou et al.

(10) Patent No.: US 8,599,292 B2
(45) Date of Patent: Dec. 3, 2013

(54) CMOS SENSOR WITH LOW PARTITION NOISE AND LOW DISTURBANCE BETWEEN ADJACENT ROW CONTROL SIGNALS IN A PIXEL ARRAY

(75) Inventors: Kuo-Yu Chou, Hsinchu (TW); Calvin Yi-Ping Chao, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 380 days.

(21) Appl. No.: 12/858,514

(22) Filed: Aug. 18, 2010

(65) Prior Publication Data
US 2012/0044398 A1 Feb. 23, 2012

(51) Int. Cl.
H04N 5/335 (2011.01)
H01L 27/00 (2006.01)
H01L 31/062 (2012.01)

(52) U.S. Cl.
USPC ......... 348/294; 348/243; 250/208.1; 257/291

(58) Field of Classification Search
USPC ......... 348/241, 243, 249, 256, 307, 308, 313; 250/208.1; 257/291, 292, 294, 440, 257/443–448
See application file for complete search history.

(56) References Cited

U.S. PATENT DOCUMENTS

| 6,573,777 B2* | 6/2003 | Saint-Laurent et al. ...... 327/276 |
| 6,771,162 B1* | 8/2004 | Moss .......................... 340/14.62 |
| 2006/0006915 A1* | 1/2006 | Yan et al. ....................... 327/175 |
| 2006/0145210 A1 | 7/2006 | Kim |
| 2006/0181337 A1* | 8/2006 | Dreps et al. ................... 327/543 |
| 2006/0186504 A1* | 8/2006 | Bae et al. ....................... 257/462 |
| 2007/0001101 A1 | 1/2007 | Sundararaman et al. |
| 2007/0132868 A1 | 6/2007 | Lee et al. |
| 2009/0187874 A1 | 7/2009 | Wu et al. |
| 2010/0271247 A1* | 10/2010 | Lee et al. ....................... 341/155 |

FOREIGN PATENT DOCUMENTS

| CN | 1809128 A | 7/2006 |
| CN | 1812491 A | 8/2006 |
| CN | 1980335 A | 6/2007 |
| CN | 101488741 A | 7/2009 |

OTHER PUBLICATIONS

Lai, J. et al., "Reset and Partition Noise in Active Pixel Image Sensors", IEEE Transactions on Electron Devices, 2006, 52(10):1-4.
Chinese Office Action dated Jan. 30, 2013, as issued in Corresponding Chinese Application No. 201110005225.2.

* cited by examiner

Primary Examiner — Aung S Moe
Assistant Examiner — Mekonnen Dagnew
(74) Attorney, Agent, or Firm — Duane Morris LLP

(57) ABSTRACT

A CMOS image sensor includes a pixel array including a plurality of unit pixels with individual rows of unit pixels being coupled to respective row control signal lines, and a buffer including plural row control signal drivers. Each driver is coupled to a respective one of the row control signal lines and is configured to provide a row control signal pulse to a respective row control signal line in response to an input pulse when the row control signal line is in an active state and to bias the row control signal line at a ground voltage when the respective row control signal line is in an inactive state. Each driver has a first drive capability when the row control signal line is in the active state and a second drive capability greater than the first drive capability when the row control signal line is in an inactive state.

10 Claims, 11 Drawing Sheets

CMOS SENSOR WITH LOW PARTITION NOISE AND LOW DISTURBANCE BETWEEN ADJACENT ROW CONTROL SIGNALS IN A PIXEL ARRAY

FIELD OF THE INVENTION

The present invention relates to a row control circuit of a CMOS image sensor, and more particularly to schemes for reducing partition noise and disturbance between adjacent row control signals.

BACKGROUND OF THE INVENTION

An image sensor is a semiconductor device that converts an optical image into an electric signal. One such image sensor is the complementary metal oxide semiconductor (hereinafter, referring to a CMOS) image sensor. The CMOS image sensor includes a plurality of unit pixels fabricated through CMOS processes. Each of the unit pixels includes one photodiode and three or four MOS transistors for driving the unit pixel. The CMOS image sensor employs CMOS technology that uses a control circuit and a signal processing circuit as a peripheral circuit. The MOS transistors are formed based on the number of pixels, while the output data is successively detected through the use of the MOS transistors.

In fabricating these various kinds of image sensors, many attempts to increase photosensitivity have been made. One such attempt is a light integrating technology. For example, the CMOS image sensor includes a photodiode for sensing light and a CMOS logic circuit for processing the sensed light into an electric data signal. In order to increase photosensitivity, an attempt to increase a fill factor has been made. The fill factor is a ratio of a photodiode with respect to a total area of the image sensor.

FIG. 1, which has been reprinted from U.S. Published Application No. 2006/0186504A1 to Bae et al., the entirety of which is hereby incorporated by reference, is a circuit diagram showing a unit pixel of a CMOS image sensor, in which the unit pixel includes four transistors. As shown, the unit pixel of the image sensor includes a photodiode PD constructing a PNP junction, a PNPN junction or the like, a transfer transistor TX, a floating diffusion node FD, a reset transistor RX, a drive transistor DX, and a select transistor SX. The photodiode PD receives light from an object to generate corresponding electron-hole pairs, i.e., photogenerated charges. The transfer transistor TX transfers the photogenerated charges accumulated at the photodiode PD to the floating diffusion node FD when the transfer transistor TX is turned on. When the transfer transistor TX is turned on, the floating diffusion node FD receives the photogenerated charges transferred from the transfer transistor TX. The reset transistor RX resets a voltage of the floating diffusion node FD to a power voltage VDD level in response to a reset signal. An amount of turning on a gate of the drive transistor DX is varied with an electric signal corresponding to the photogenerated charges transferred from the floating diffusion node FD, so that the drive transistor DX outputs the electric signal in proportion to the amount of the photogenerated charges. The select transistor SX, which is turned on based on a select signal, outputs a signal of the unit pixel through the drive transistor DX.

As shown in FIG. 1, a reference numeral LX represents a load transistor. The floating diffusion node FD has a predetermined capacitance Cfd.

The operation principle of obtaining an output voltage VOUT from the unit pixel of FIG. 1 is described below.

First, the transfer transistor TX, the reset transistor RX, and the select transistor SX are turned off. At this time, the photodiode PD is in a fully depleted state. A light integration is started to collect the photogenerated charges at the photodiode PD.

After an appropriate light integration time, the voltage of the floating diffusion node FD is reset as the reset transistor RX is turned on. Then, the select transistor SX is turned on. At this time, a first output voltage V1 of the unit pixel at a reset operation is measured. The measured value means a DC level shift of the voltage of the floating diffusion node FD.

Then, the transfer transistor TX is turned on so that all the photogenerated charges at the photodiode PD are transferred to the floating diffusion node FD. Then, the transfer transistor TX is turned off. At this time, a second output voltage V2 due to the charges transferred to the floating diffusion node FD is measured.

The output voltage VOUT, which is a transfer result of the photogenerated charges, is obtained from the difference between the first output voltage V1 and the second output voltage V2. That is, the output voltage VOUT is purely a signal voltage except for a noise. This method is referred to as a correlated double sampling (CDS).

The transfer transistor TX transfers the photogenerated charges to the floating diffusion node FD. Meanwhile, the transfer transistor TX has several problems when a transfer control signal applied to a gate of a transfer transistor is dropped from a logic level 'HIGH' to a logic level 'LOW', that is, when it changes from a turned-on state to a turned-off state. When a falling time of the transfer control signal is short, a charge injection to the floating diffusion node FD can occur. The charge injection occurs differently in pixels. Therefore, when seen from the outside, it appears that noise occurs. This phenomenon is called partition noise. Since the partition noise is considered as noise on a screen, it acts as a factor that degrades the performance of the image sensor.

FIG. 2 portrays a prior art CMOS image sensor 10 having a conventional buffer 12 and pixel array 14. The pixel array 14 has "m" number of rows and "n" number of columns of unit pixels P, though only two rows of pixels are shown for ease of illustration. The buffer passes row control signals such as TX, RX and SX from a row control circuit to the pixel array 14. For ease of illustration, FIG. 2 shows the provision of transfer control signal $TX_0$ and $TX_1$ from drivers $Drv_0$ and $Drv_1$, respectively. The conventional buffer 12 includes a plurality of inverters for passing the transfer control signals $TX_0$ to $TX_m$ to the rows of pixels. If no slew rate control is provided within buffer 12 for controlling the slope of the transition of the control signal (e.g., TX) from high to low, a wide distribution of slopes for the control signal as seen at individual pixels (i.e., $TX_m[0]$ to $TX_m[n]$) can occur due to the parasitic wire resistances R and parasitic capacitances C, as shown in FIG. 3A. In particular, FIG. 3A illustrates simulation results when no slew rate control is employed in a buffer 12. As can be seen from slope lines 22, there is a wide distribution in the slopes of the down transition of the control signal TX[0] to TX[n], which results in different charge injection at individual pixels and clock-feed through, which manifests as partition noise. When slew rate control is employed within buffer 12, a narrow distribution in the control signal down slopes is realized, as shown by slope lines 24 in FIG. 3B.

Bae et al. describe various slew rate control implementations for buffer 12 that can improve the partition noise of the CMOS image sensor. Specifically, these embodiments increase the falling time of the transfer control signal applied to the gate of the transfer transistor. In a first embodiment, shown in FIG. 4, the falling time of the control signal is increased by reducing a W/L ratio of an NMOS transistor N1 of the CMOS inverter of buffer 12. Specifically, a resistance through the transistor N1 can be increased, i.e., a current is decreased, by increasing the length L or decreasing the width W, thereby increasing the falling time of the transfer control signal. Meanwhile, the width W of the gate electrode is related to the design rule of the device. Accordingly, a method of reducing the W/L ratio without modifying the design rule is to increase the length L of the gate electrode when the width W of the NMOS transistor is fixed.

A second approach to slew rate control disclosed in Bae et al. is shown in FIG. 5 and involves serially connecting a number of NMOS transistors (e.g., N1 to N4) to obtain a desired falling time.

An alternative approach to slew rate control is disclosed in U.S. Patent Publication No. 2007/0001101 A1, filed by Raj Sundararaman et al., the entirety of which is hereby incorporated by reference. Sundararaman et al. uses bias control to control the slew rate of the control signal for reducing partition noise of a CMOS image sensor.

Another important problem that arises in the use of CMOS image sensors is the coupling of control signals between adjacent rows due to parasitic coupling capacitances between adjacent rows (labeled Cc in FIG. 2). The prior art discussed above addresses the partition noise problem but does not address coupling noise and other issues attributable to these parasitic capacitances. In fact, the slew rate control approaches of the prior art can exacerbate the problems associated with coupling of adjacent signals between rows. For example, in some prior art approaches, the NMOS transistors of the buffer 12 have high turn on resistances in order to provide the desired slew rate. An unselected row should be pulled low at its static state. However, due to the high NMOS resistances in the drivers, the control signals for pulling the unselected row are weak and adjacent signals from an active row are easily coupled to the inactive row. This results in low power efficiency due to leakage current or even improper operation of the CMOS image sensor.

A driver for CMOS sensor that reduces partition noise and simultaneously minimizes the negative effects of capacitance coupling between adjacent rows is desired.

SUMMARY OF THE INVENTION

A CMOS image sensor includes a pixel array including a plurality of unit pixels with individual rows of unit pixels being coupled to respective row control signal lines, and a buffer including plural row control signal drivers. Each driver is coupled to a respective one of the row control signal lines and is configured to provide a row control signal pulse to a respective row control signal line in response to an input pulse when the row control signal line is in an active state and to bias the row control signal line at a ground voltage when the respective row control signal line is in an inactive state. Each driver has a first drive capability when the row control signal line is in the active state and a second drive capability greater than the first drive capability when the row control signal line is in an inactive state.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. Terms concerning electrical attachments, coupling and the like, such as "connected" and "interconnected," refer to a relationship wherein structures communicate with one another either directly or indirectly through intervening structures, unless expressly described otherwise.

An improved image sensor, such as a CMOS image sensor, is described below in connection with the drawings. In embodiments of the sensor, the CMOS image sensor is configured to reduce both partition noise of the CMOS image sensor and the disturbance between adjacent row control signals.

Figure 1:
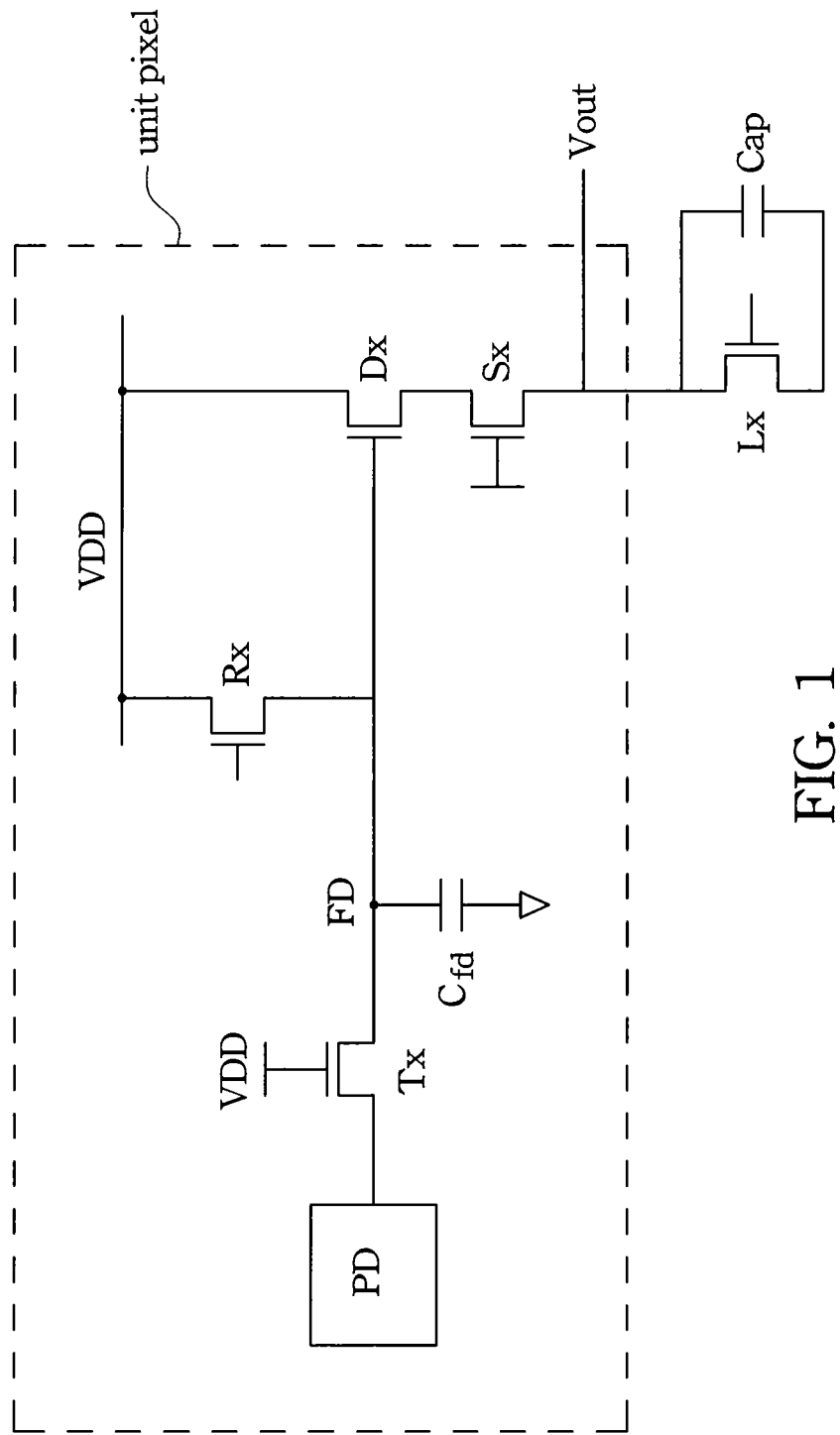
FIG. 1 is a circuit diagram showing a unit pixel of a prior art CMOS image sensor.
Figure 2:
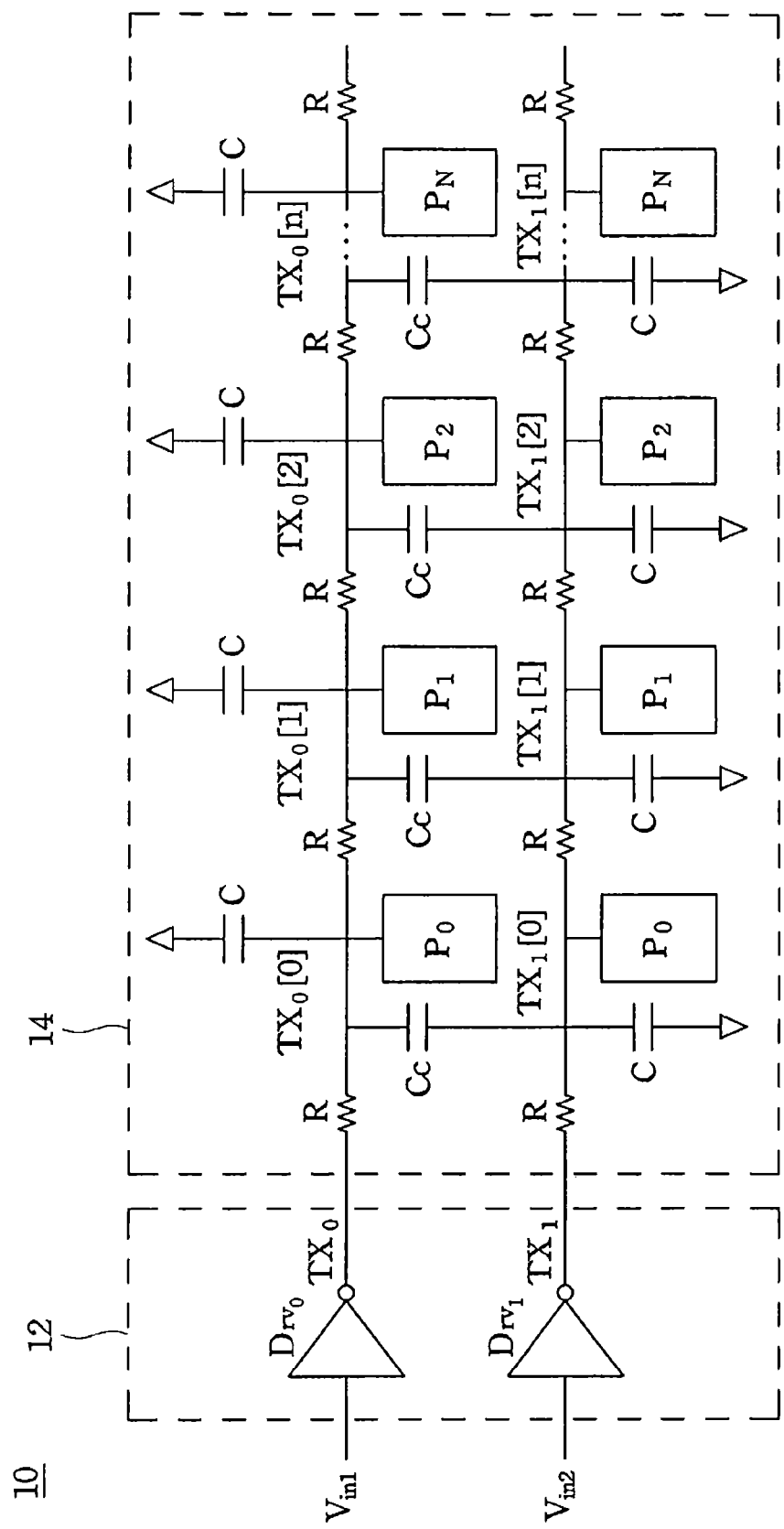
FIG. 2 is a circuit diagram of a prior art CMOS image sensor having a row driver buffer connected to a pixel array.
Figure 3A:
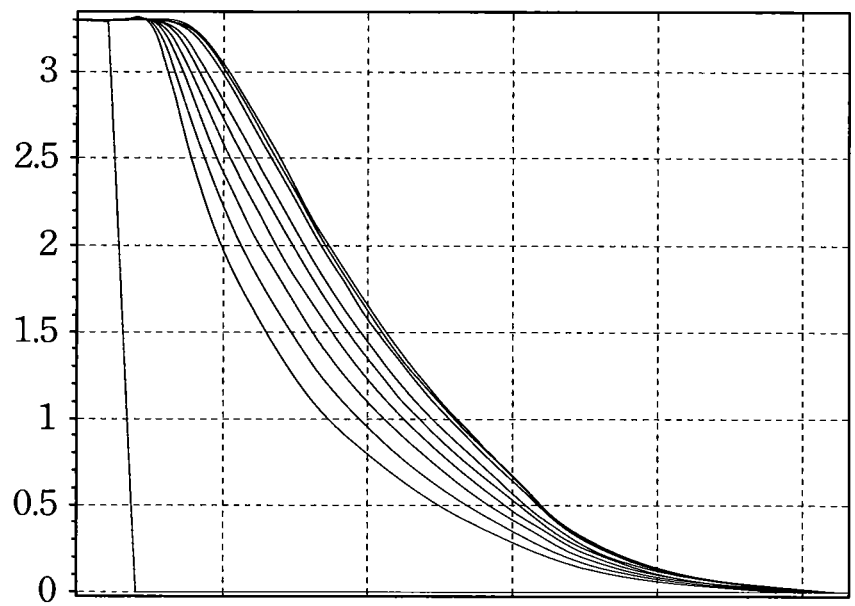
FIG. 3A is a graph depicting a row control circuit simulation of an image sensor of the type shown in FIG. 2 when no slew rate control is employed to reduce partition noise.
Figure 3B:
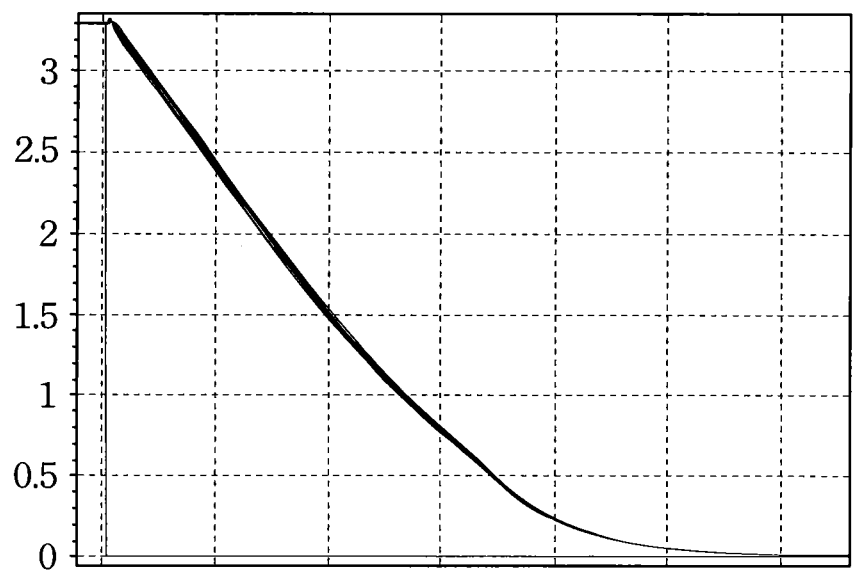
FIG. 3B is a graph depicting a row control circuit simulation of an image sensor of the type shown in FIG. 2 when slew rate control is employed to reduce partition noise.
Figure 4:
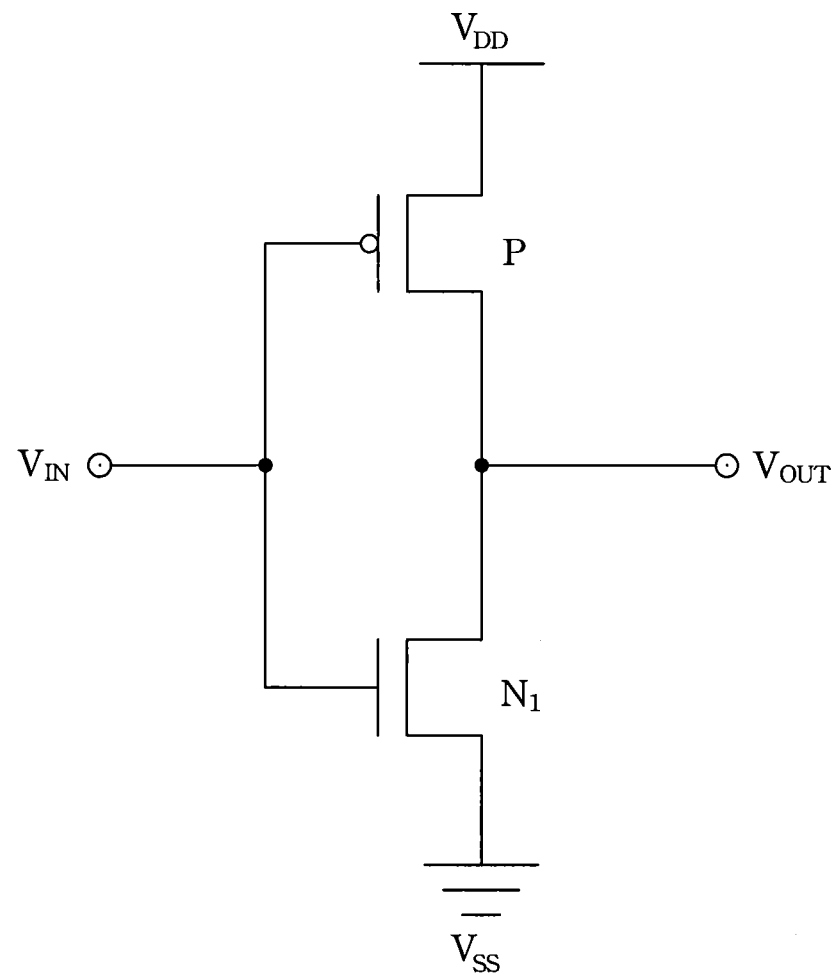
FIG. 4 is a circuit diagram of an inverter driver in a buffer of a prior art CMOS image sensor.
Figure 5:
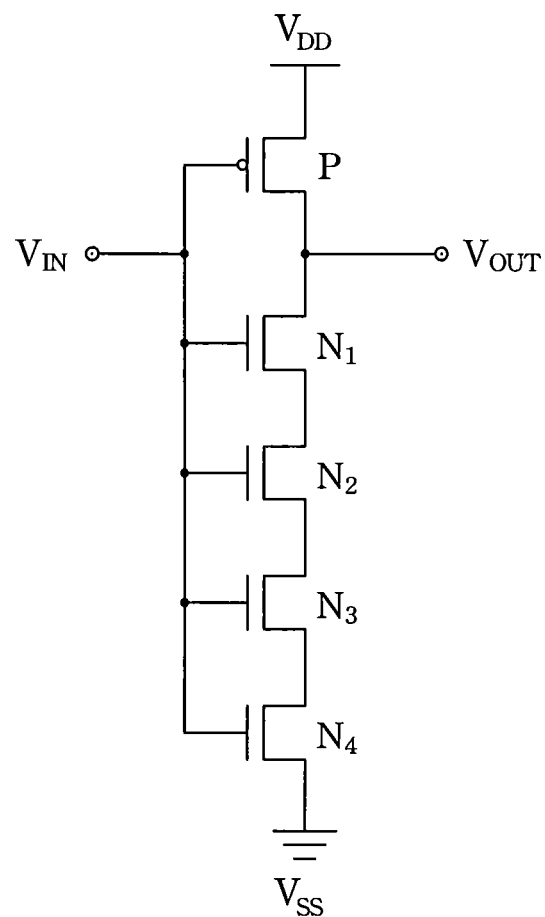
FIG. 5 is a circuit diagram of an alternative inverter driver in a buffer of a prior art CMOS image sensor.
Figure 6:
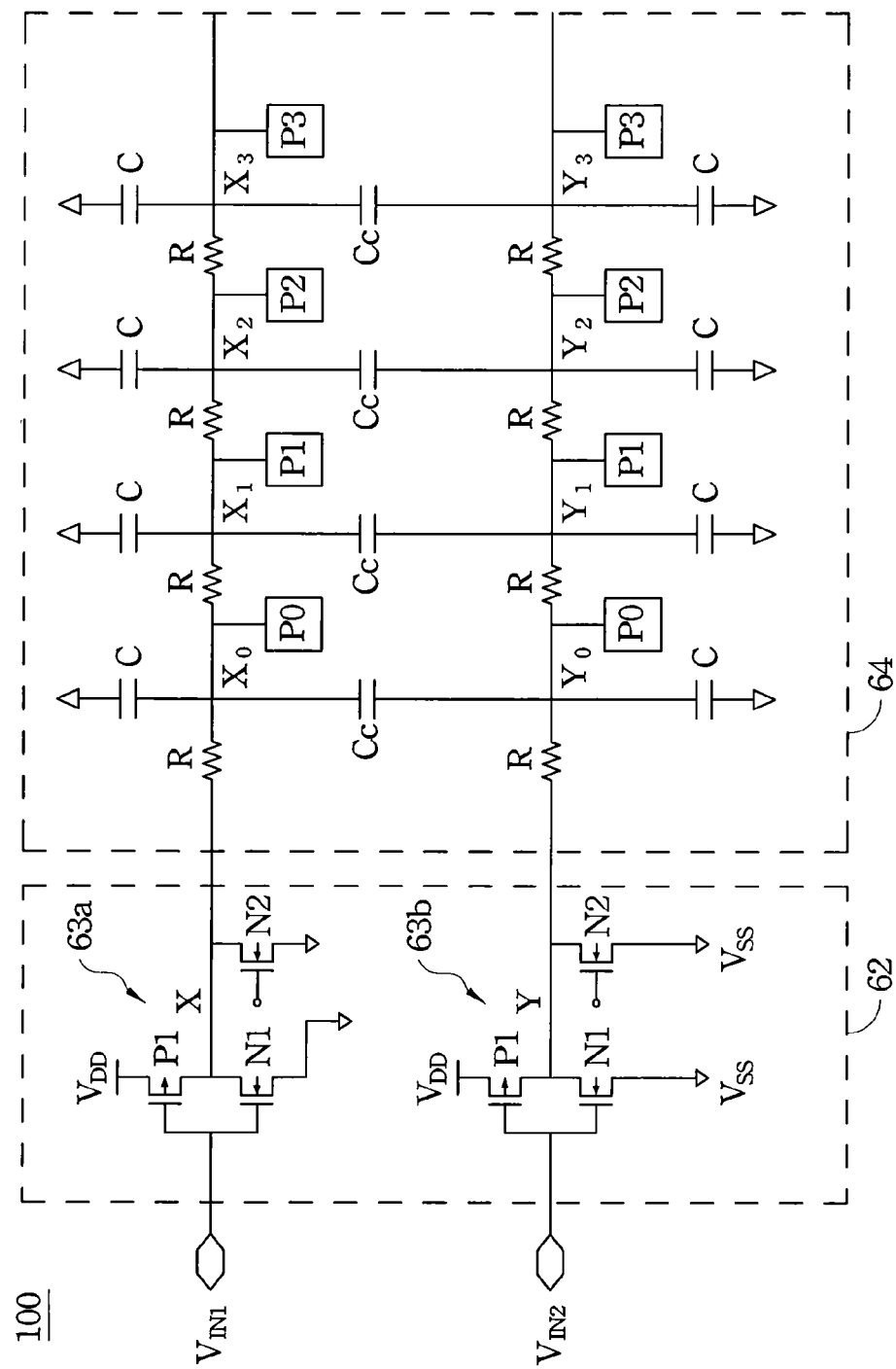
FIG. 6 is a circuit diagram of a CMOS image sensor illustrating an approach to row control signal driving for simultaneous reduction of partition noise and coupling capacitance noise.

FIG. 6 is a circuit diagram of an embodiment of the present invention of a CMOS image sensor 100 having a buffer 62 for providing row control signals and a pixel array 64 with two adjacent row control signal lines, X and Y. While only two rows X and Y and only for columns (0 to 3) are illustrated, it should be understood that this is only for ease of illustration. The array can include any number of rows and columns. For example, a typical array would have 1200 rows and 1600 columns. Moreover, the buffer 62 can provide any row control signals such as control signals for a transfer transistor (TX), a reset transistor (RX), a select transistor (SX) or a drive transistor (DX) of a unit pixel described above. These control signals are illustrated generically as control signals $X_0$ to $X_3$ (for row X) and $Y_0$ to $Y_3$ (for row Y). In an exemplary embodiment, the row control signal is a control signal TX for a transfer transistor $T_X$ though the invention is not so limited.

Buffer 62 includes a CMOS driver/inverter associated with each row control signal line of the array 64. Buffer 62 is responsive to input pulse signals $Vin_1$, $Vin_2$, etc. to provide pulsed row control signals X (manifested at pixels P0 to Pn of row X as row control signals $X_0$ to Xn) and Y (manifested at pixels P0 to Pn of row Y as control signals $Y_0$ to $Y_n$). Buffer 62 is shown as having inverter drivers 63a and 63b. Each driver 63 is configured to have low drive capability when a selected row is in the active state, so as to provide a low slew rate for reducing partition noise. Each driver 63 is also configured to have a higher drive capability when the row to which it is connected is in the inactive state. The higher drive capability helps maintain the inactive row at a low DC value (e.g., ground or close thereto) for reducing coupling induced noise. In the illustrated embodiment, this dual drive capability is provided in part by the addition of an auxiliary pull down transistor N2 coupled between the row control signal line (i.e., output of the CMOS inverter) and the low rail power supply node (e.g., ground or Vss). The gate bias of NMOS N2 is controlled to adjust the drive capability of the driver 63. Main pull down transistors N1 is sized (or otherwise configured) to have a high turn on resistance, which controls the slew rate of the row control signal to reduce partition noise. In embodiments, NMOS transistor N2 is sized or otherwise configured to have a lower turn on resistance and is thus capable of the higher drive current needed to keep an unselected row line in a static state, i.e., to reduce coupling susceptibility from control signals on adjacent active row control signal lines. Assume for example that row X is in an active (transient) state, then NMOS N2 of the driver 63a is off. Transistor N1 of driver 63a controls the down slope slew rate of the control signal. Since row X is active, row Y is inactive. As such, auxiliary NMOS N2 of driver 63b is on. This drives the row line Y to a low DC voltage (e.g., ground), and helps maintain it at that DC level to counter any capacitance coupling of the control signal from row X to row Y. Basically, an active row control signal is driven with a drive of low drive capability, to help reduce partition noise, while an adjacent static row control signal is driven by a driver with a high drive capability, to reducing the coupling effect.

Simulations confirmed the operation of the above-described buffer architecture to simultaneously reduce both partition noise and coupling noise. Good uniformity in the slopes of the row control signals at each pixel were observed, which illustrates operation to reduce partition noise, along with an over 70% reduction in the peaks of the signal coupling between an active row control signal line and an adjacent row control signal line.

Figure 7A:
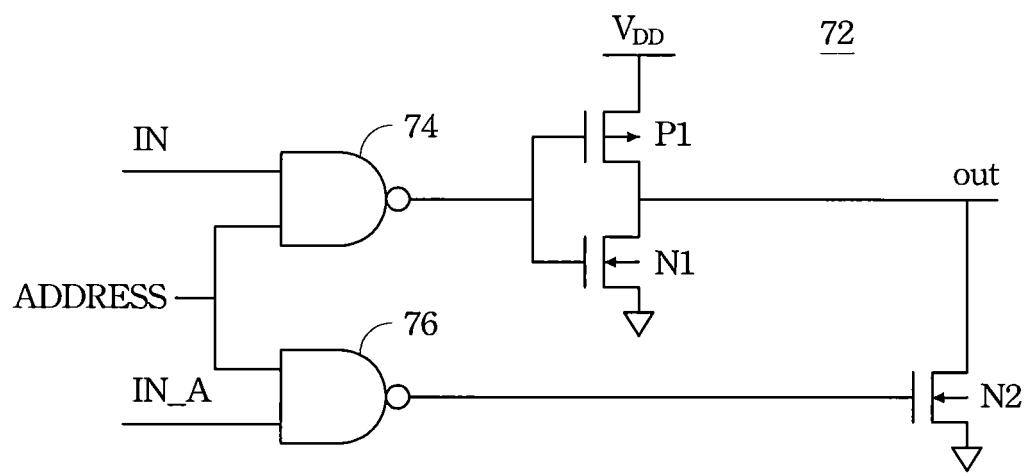
FIG. 7A is a circuit diagram of an embodiment of a buffer of the present invention.
Figure 7B:
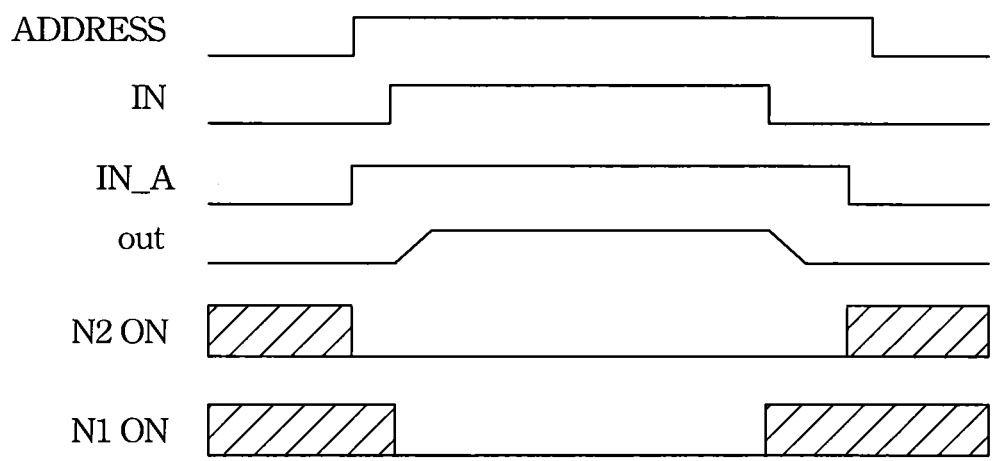
FIG. 7B is a timing diagram illustrating the operation of the buffer of FIG. 7A.

FIG. 7A illustrates one specific implementation of a row control signal driver 72 as discussed above for addressing both partition noise and coupling noise, and FIG. 7B is a timing diagram illustrating the operation of the driver of FIG. 7A.

Figure 11:
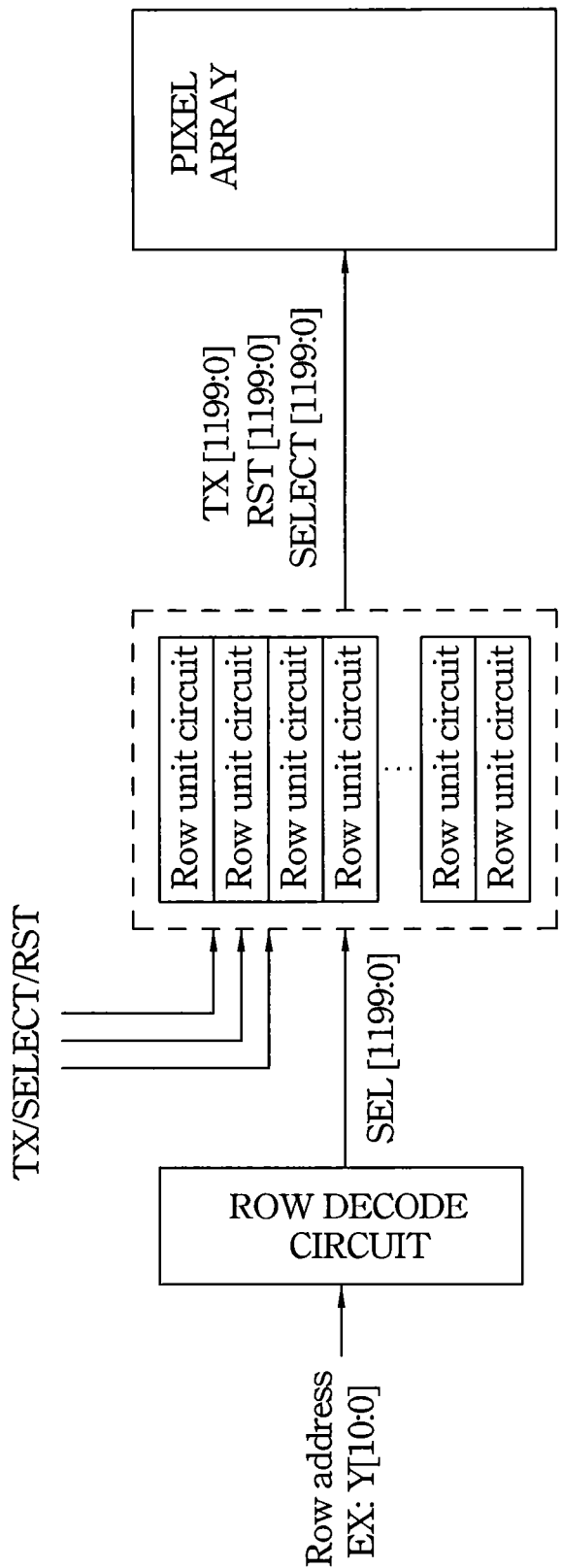
FIG. 11 illustrates a row decoding architecture.

The control signal driver 72 of FIG. 7A includes a standard inverter driver discussed above formed from a NMOS/PMOS pair N1/P1. An additional pull down transistor NMOS N2 is coupled to the output of the inverter, which is coupled to a given row control signal line. The NMOS N2 is controlled so as to ensure that it is in the off state while the row control signal line is active, most importantly while the control signal is transitioning from low to high state and vice versa, and to turn the NMOS N2 on when the row control signal line is inactive. A control circuit is provided to properly bias the NMOS N2 in response to an ADDRESS signal representing the selection of a row of pixels. In one embodiment, the control circuit includes NAND gates 74 and 76. The output of NAND gate 74 is coupled to the input of the N1/P1 inverter, and the output of NAND gate 76 is coupled to the gate terminal of NMOS N2. The NAND gate 74 has inputs coupled to address signal ADDRESS and to signal IN. It should be understood that signal ADDRESS is the output signal from a row decoder. Signal IN represents a control signal like TX, RST or SELECT. IN_A is an extra signal (e.g., TX_A, RST_A or SELECT_A) for slew rate control. An example of a row decoding architecture is illustrated in FIG. 11 and will be familiar to those or ordinary skill in the art. NAND gate 76 also has one input coupled to ADDRESS and has a second input coupled to signal IN_A. The timing diagram illustrates when both N1 and N2 are on. This circuit operates such that N2 is off when the row control signal is transient but on once the transition is complete. Preferably in this embodiment, N1 is a small device, for providing the low slew rate, and N2 is a relatively larger device for maintaining the row control signal line at ground. That said, N2 must be on after the transient is complete. The timing gap between IN and IN_A should be several periods long, e.g., 25 ns.

Figure 8A:
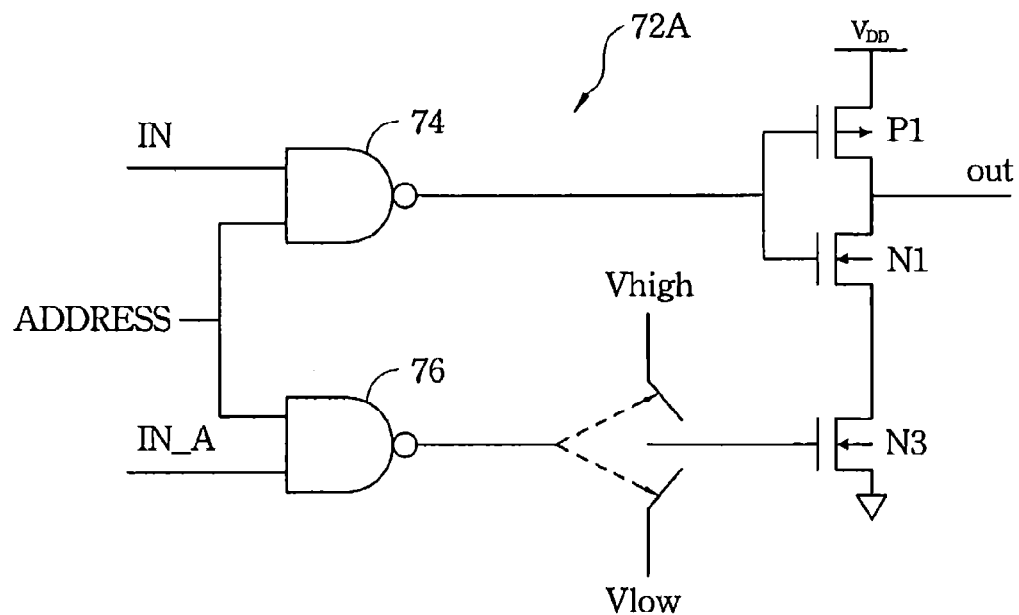
FIG. 8A is a circuit diagram of an alternative embodiment of a buffer of the present invention.
Figure 8B:
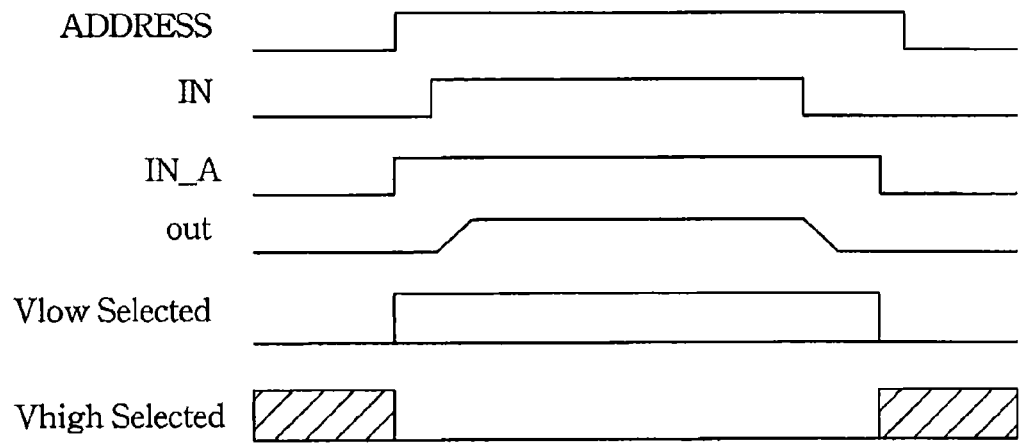
FIG. 8B is a timing diagram illustrating the operation of the buffer of FIG. 8A.

FIGS. 8A and 8B illustrate an alternative embodiment of a row control signal driver. FIG. 8A is a circuit diagram of the driver circuit 72A, and FIG. 8B shows a timing diagram illustrating the operation of the circuit 72A of FIG. 8A. As with the embodiment of FIG. 7A, the driver includes an inverter (N1/P1) and a pair of NAND gates 74, 76. Unlike the embodiment of FIG. 7A, the driver 72A includes an NMOS transistor N3 connected between the source terminal of N1 and ground. The output of NAND 76 is configured to select between two alternative positive bias levels ($V_{high}$ and $V_{low}$) for controlling the drive capability of NMOS N3. Referring to FIG. 8B, signals ADDRESS, IN, IN_A and OUT are identical to those shown in FIG. 7B. As can be seen from FIG. 8B, when the row control signal line is active (in transient state), the low bias ($V_{low}$) is selected for driving N3. During this time, N3 is on but the drive capability of N3 is low and slew rate control is provided. When the row control signal line is inactive, the high bias ($V_{high}$) is selected for increasing the drive capability of N3, thus providing higher drive current for driving OUT to ground reducing the effect of coupling from adjacent row control signal lines. In embodiments where VDD is 2.8V, $V_{high}$ can be 1.5V and $V_{low}$ can be 0.8V.

Figure 9A:
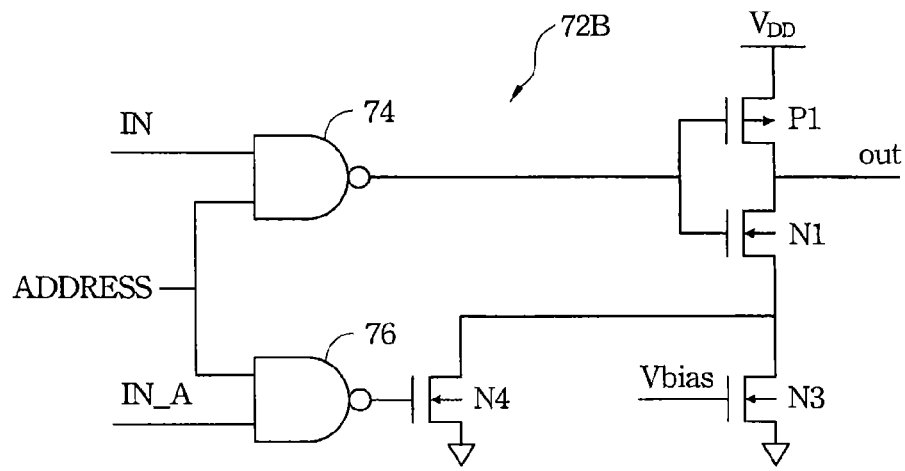
FIG. 9A is a circuit diagram of another alternative embodiment of a buffer of the present invention.
Figure 9B:
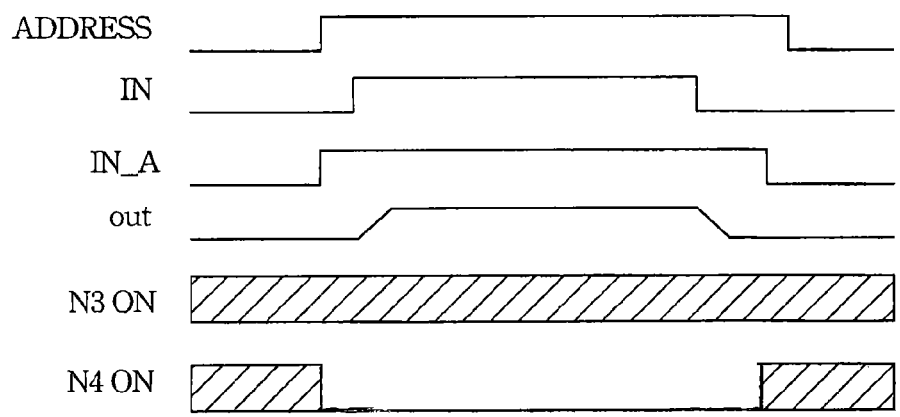
FIG. 9B is a timing diagram illustrating the operation of the buffer of FIG. 9A.

FIG. 9A illustrates a circuit diagram of an alternative embodiment of a row control signal driver 72B and FIG. 9B is a timing diagram illustrating the operation of the driver 72B. Like the embodiments of FIGS. 7A and 7B, the driver 72B has an inverter formed from NMOS/PMOS pair N1/P1, first NAND gate 74 and second NAND gate 76. These NAND gates are biased in the same manner as with drivers 72 and 72A by signals IN, ADDRESS and IN_A. Like driver 72A, the driver 72B includes an NMOS N3 coupled between the source of NMOS N1 and ground. However, the gate terminal of N3 is biased with signal $V_{bias}$. $V_{bias}$ is a constant voltage, and its purpose is to control the slew rate of the circuit. Transistor N4 is used to pull down the signal when the circuit is inactive and is larger than N1 and N3. Transistor N3 would be of similar size as the corresponding transistor of FIG. 8A. In embodiments, Vbias is set between about 0.5V to 0.8V. The output of NAND 76 is provided to the gate terminal of NMOS N4, which is also coupled between the source terminal of N1 and ground.

Figure 10A:
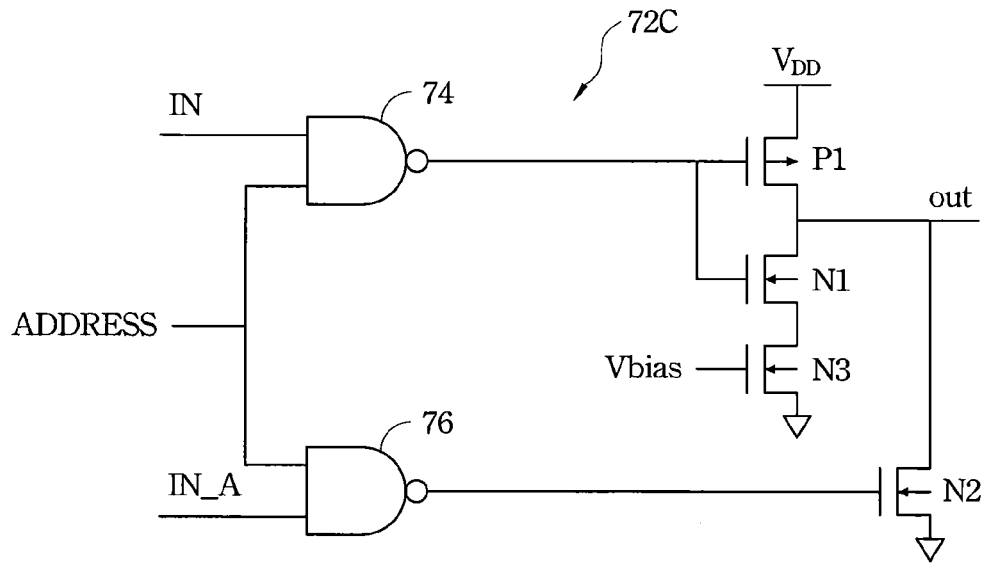
FIG. 10A is a circuit diagram of yet another alternative embodiment of a buffer of the present invention.
Figure 10B:
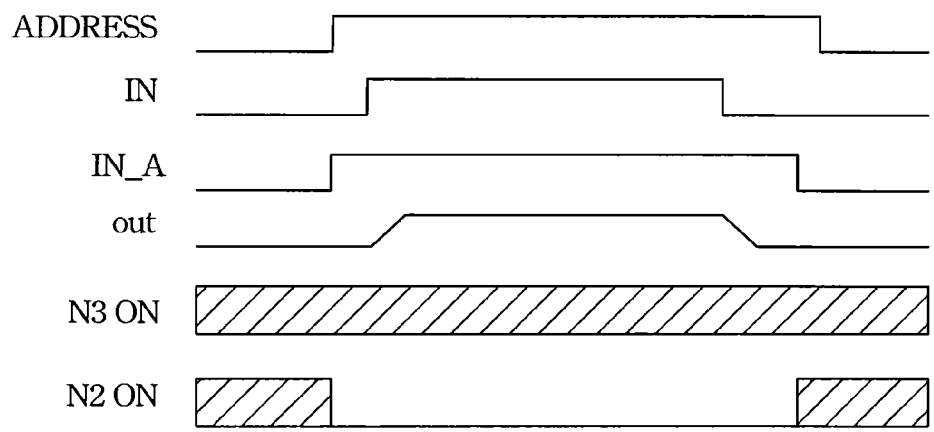
FIG. 10B is a timing diagram illustrating the operation of the buffer of FIG. 10A.

FIG. 10A illustrates an alternative embodiment of a row control signal driver 72C, and FIG. 10B is a timing diagram illustrating the operation of the driver 72C of FIG. 10A. Like the drivers 72, 72A and 72B, the driver 72C has an inverter (i.e., NMOS/PMOS pair N1/P1) and a pair of NAND logic gates 74 and 76. An NMOS N3 is coupled between the source of NMOS N1 and ground, and is biased by bias $V_{bias}$ as described in connection with FIG. 9A. The sizes of N1 and N3 are as described above in connection with FIGS. 8A and 9A. An NMOS N2 described above in connection with FIG. 7A and sized as described in connection therewith is coupled between the output of the inverter and ground, and has a gate terminal controlled by the output of NAND 106.

As described above, a buffer is provided herein that provides for both reduction in partition noise, via slew rate control, and for reduction in coupling noise due to control signal coupling between adjacent rows. Coupling noise can be reduced by placing selected/active rows under conditions tailored to minimize partition noise and non-selected/inactive (static) rows under conditions tailored to reducing coupling of signals from the active rows to adjacent rows.

Moreover, the improved buffer is effective in reducing intra-row disturbance. One row array may have several control signals, e.g., TX, SELECT, RST. Control signal TX[0] may be disturbed by SELECT[0] or RST[0]. The buffer design provides robust control signals that are less susceptible to this kind of intra-row disturbance.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A CMOS image sensor, comprising:
   a pixel array comprising a plurality of unit pixels arranged in a plurality of rows and columns, individual rows of unit pixels being coupled to respective row control signal lines; and
   a buffer comprising a plurality of row control signal drivers, each row control signal driver being coupled to a respective one of the row control signal lines, each row control signal driver configured to provide a row control signal pulse to a respective row control signal line in response to an input pulse when the row control signal line is in an active state and to bias said row control signal line at a ground voltage when the respective row control signal line is in an inactive state,
   wherein each row control signal driver has a first drive capability when the row control signal line is in the active state and a second drive capability greater than the first drive capability when the row control signal line is in an inactive state, and
   wherein each row control signal driver comprises an inverter having an input for receiving the input pulse and an output coupled to its respective row control signal line, the inverter comprising a PMOS transistor coupled between a voltage supply node and the respective row control signal line and a first NMOS transistor, wherein gate and drain terminals of the PMOS transistor and first NMOS transistor are coupled together to form the inverter input and output,
   the row control signal driver further comprising a second NMOS transistor coupled between a source terminal of the first NMOS transistor and the ground node, wherein a gate bias of the second NMOS transistor is regulated to control a drive capability of the second NMOS transistor.

2. The CMOS image sensor of claim 1, wherein each row control signal driver further comprises a control circuit for switching the row control signal driver between the first and second drive capabilities.

3. The CMOS image sensor of claim 1, wherein the gate bias of the second NMOS transistor is set to a first positive bias level when the row control signal line is in the active state and to a second positive bias level when the row control signal line is in the inactive state, the second positive bias level being greater than the first positive bias level.

4. The CMOS image sensor of claim 3, wherein each row control signal driver further comprises a control circuit for selectively coupling a gate terminal of the second NMOS transistor to the first and second positive bias levels.

5. The CMOS image sensor of claim 1, wherein each unit pixel includes a photodiode, a transfer transistor, a reset transistor, a drive transistor and a select transistor, and the row control signal drivers provide transfer transistor control signals.

6. A CMOS image sensor, comprising:
   a pixel array comprising a plurality of unit pixels arranged in a plurality of rows and columns, individual rows of unit pixels being coupled to respective row control signal lines; and
   a buffer comprising a plurality of row control signal drivers, each row control signal driver being coupled to a respective one of the row control signal lines, each row control signal driver configured to provide a row control signal pulse to a respective row control signal line in response to an input pulse when the row control signal line is in an active state and to bias said row control signal line at a ground voltage when the respective row control signal line is in an inactive state,
   wherein each row control signal driver has a first drive capability when the row control signal line is in the active state and a second drive capability greater than the first drive capability when the row control signal line is in an inactive state, and
   wherein each row control signal driver comprises:
   an inverter having an input for receiving the input pulse and an output coupled to its respective row control signal line, the inverter comprising a PMOS transistor coupled between a voltage supply node and the respective row control signal line and a first NMOS transistor, wherein gate and drain terminals of the PMOS transistor and first NMOS transistor are coupled together to form the inverter input and output,
   a second NMOS transistor coupled between a source terminal of the first NMOS transistor and the ground node, a gate terminal of the second NMOS transistor is coupled to a positive voltage bias node to bias the third NMOS transistor in an on-state; and
   a third NMOS transistor coupled between the source terminal of the first NMOS transistor and the ground node, wherein the third NMOS transistor is biased to be in an off state when the row control signal line is in the active state and in an on state when the row control signal line is in the inactive state.

7. A CMOS image sensor, comprising:
   a CMOS pixel array comprising a plurality of unit pixels arranged in a plurality of rows and columns, individual rows of unit pixels being coupled to respective row control signal lines; and
   a buffer comprising a plurality of row control signal drivers, each row control signal driver being coupled to a respective one of the row control signal lines, each row control signal driver comprising an inverter for providing a row control signal pulse to a respective row control signal line in response to an input pulse when the row control signal line is in an active state, the row control signal driver being configured to bias said output node at a ground voltage when the respective row control signal line is in an inactive state, each row control signal driver further comprising a controller for controlling the drive capability of the row control signal driver, the row control signal driver having a first drive capability when the row control signal line is in the active state to reduce partition noise and a second drive capability greater than the first drive capability when the row control signal line is in an inactive state to reduce coupling effect between adjacent row control signals lines, wherein the inverter of each row control signal driver comprises a PMOS transistor and a first NMOS transistor coupled between a power supply node and a ground node, each row control signal driver further comprising a second NMOS transistor coupled between the respective row control signal line and the ground node, and wherein the controller has an output coupled to a gate terminal of the second NMOS transistor, wherein the controller is responsive to an address control signal and a slew rate control signal to turn the second NMOS transistor on when the row control signal line is in an inactive state and to turn the second NMOS transistor off when the row control signal line is in an active state.

8. A CMOS image sensor, comprising:

a CMOS pixel array comprising a plurality of unit pixels arranged in a plurality of rows and columns, individual rows of unit pixels being coupled to respective row control signal lines; and a buffer comprising a plurality of row control signal drivers, each row control signal driver being coupled to a respective one of the row control signal lines, each row control signal driver comprising an inverter for providing a row control signal pulse to a respective row control signal line in response to an input pulse when the row control signal line is in an active state, the row control signal driver being configured to bias said output node at a ground voltage when the respective row control signal line is in an inactive state, each row control signal driver further comprising a controller for controlling the drive capability of the row control signal driver, the row control signal driver having a first drive capability when the row control signal line is in the active state to reduce partition noise and a second drive capability greater than the first drive capability when the row control signal line is in an inactive state to reduce coupling effect between adjacent row control signals lines, wherein the inverter of each row control signal driver comprises a PMOS transistor and a first NMOS transistor coupled between a power supply node and a ground node, each row control signal driver further comprising a second NMOS transistor coupled between a source terminal of the first NMOS transistor and the ground node, wherein a gate bias of the second NMOS transistor is set to a first positive bias level when the row control signal line is in the active state and at a second positive bias level when the row control signal line is in the inactive state, the second positive bias level being greater than the first positive bias level, and wherein the controller is responsive to an address control signal and a slew rate control signal to provide an output for selecting between the first and second positive bias levels for the gate bias of the second NMOS transistor.

9. A CMOS image sensor, comprising:

a CMOS pixel array comprising a plurality of unit pixels arranged in a plurality of rows and columns, individual rows of unit pixels being coupled to respective row control signal lines; and a buffer comprising a plurality of row control signal drivers, each row control signal driver being coupled to a respective one of the row control signal lines, each row control signal driver comprising an inverter for providing a row control signal pulse to a respective row control signal line in response to an input pulse when the row control signal line is in an active state, the row control signal driver being configured to bias said output node at a ground voltage when the respective row control signal line is in an inactive state, each row control signal driver further comprising a controller for controlling the drive capability of the row control signal driver, the row control signal driver having a first drive capability when the row control signal line is in the active state to reduce partition noise and a second drive capability greater than the first drive capability when the row control signal line is in an inactive state to reduce coupling effect between adjacent row control signals lines, wherein the inverter of each row control signal driver comprises a PMOS transistor and a first NMOS transistor coupled between a power supply node and a ground node, each row control signal driver further comprising a second NMOS transistor coupled between a source terminal of the first NMOS transistor and the ground node, and a third NMOS transistor coupled between the source terminal of the first NMOS transistor and the ground node, wherein a gate bias of the second NMOS transistor is coupled to a positive voltage bias node to bias the second NMOS transistor in an on-state, and wherein the controller is responsive to an address control signal and a slew rate control signal to provide an output for biasing the third NMOS transistor in an off state when the row control signal line is in the active state and to be in an on state when the row control signal line is in the inactive state.

10. A CMOS image sensor, comprising:

a CMOS pixel array comprising a plurality of unit pixels arranged in a plurality of rows and columns, individual rows of unit pixels being coupled to respective row control signal lines; and a buffer comprising a plurality of row control signal drivers, each row control signal driver being coupled to a respective one of the row control signal lines, each row control signal driver comprising an inverter for providing a row control signal pulse to a respective row control signal line in response to an input pulse when the row control signal line is in an active state, the row control signal driver being configured to bias said output node at a ground voltage when the respective row control signal line is in an inactive state, each row control signal driver further comprising a controller for controlling the drive capability of the row control signal driver, the row control signal driver having a first drive capability when the row control signal line is in the active state to reduce partition noise and a second drive capability greater than the first drive capability when the row control signal line is in an inactive state to reduce coupling effect between adjacent row control signals lines, wherein the inverter of each row control signal driver comprises a PMOS transistor and a first NMOS transistor coupled between a power supply node and a ground node, each row control signal driver further comprising a second NMOS transistor coupled between a source terminal of the first NMOS transistor and the ground node, and a third NMOS transistor coupled between the row control signal line and the ground node, wherein a gate bias of the second NMOS transistor is coupled to a positive voltage bias node to bias the second NMOS transistor in an on-state, and wherein the controller is responsive to an address control signal and a slew rate control signal to provide an output for biasing the third NMOS transistor to be in an off state when the row control signal line is in the active state and to be in an on state when the row control signal line is in the inactive state.

* * * * *